United States Patent
Sumi et al.

(10) Patent No.: US 9,706,692 B2
(45) Date of Patent: Jul. 11, 2017

(54) NOISE SHIELD CABLE AND METHOD OF MANUFACTURING THE SAME

(71) Applicant: Hitachi Metals, Ltd., Tokyo (JP)

(72) Inventors: Yosuke Sumi, Hitachinaka (JP);
Katsutoshi Nakatani, Hitachi (JP);
Katsuya Akimoto, Hitachi (JP);
Hiroshi Okikawa, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/207,699

(22) Filed: Jul. 12, 2016

(65) Prior Publication Data
US 2017/0027090 A1    Jan. 26, 2017

(30) Foreign Application Priority Data

Jul. 21, 2015  (JP) .................................. 2015-144103

(51) Int. Cl.
*H05K 9/00* (2006.01)
*H01B 7/18* (2006.01)
*H01B 13/08* (2006.01)
*H01B 7/02* (2006.01)

(52) U.S. Cl.
CPC ......... *H05K 9/0098* (2013.01); *H01B 7/0216* (2013.01); *H01B 7/0241* (2013.01); *H01B 7/18* (2013.01); *H01B 13/08* (2013.01); *H05K 9/0075* (2013.01)

(58) Field of Classification Search
CPC .. H05K 9/0098; H05K 9/0075; H01B 7/0216; H01B 7/0241; H01B 7/18; H01B 13/08
USPC .................................................. 174/102 P, 36
See application file for complete search history.

(56) References Cited

U.S. PATENT DOCUMENTS 6,136,429 A * 10/2000 Saito .................... H05K 9/0015
428/212
2007/0051807 A1* 3/2007 Yamaguchi .......... G06K 7/0008
235/451

FOREIGN PATENT DOCUMENTS

| GB | 631312 | * 11/1949 | .............. H01F 1/20 |
| JP | 10-056292 A | 2/1998 | |
| JP | 11-111077 A | 4/1999 | |
| JP | 3712846 B2 | 11/2005 | |

* cited by examiner

*Primary Examiner* — Timothy Thompson
*Assistant Examiner* — Charles Pizzuto
(74) *Attorney, Agent, or Firm* — Roberts Mlotkowski Safran Cole & Calderon P.C.

(57) ABSTRACT

A method of manufacturing a noise shield cable, wherein the noise shield cable includes a conductor, an insulation provided around the conductor, a noise shielding layer provided around the insulation and a sheath provided around the noise shielding layer, includes providing an insulating material including a magnetic powder, pressing and then rolling the insulating material to form a sheet, and winding the sheet around the insulation to form the noise shielding layer. An aspect ratio of the magnetic powder represented by a maximum length/a maximum thickness is more than 10.

4 Claims, 7 Drawing Sheets

81 MAGNETIC POWDER

EMS

EMI

NOISE SHIELD CABLE AND METHOD OF MANUFACTURING THE SAME

The present application is based on Japanese patent application No. 2015-144103 filed on Jul. 21, 2015, the entire contents of which are incorporated herein by reference.

BACKGROUND OF THE INVENTION

1. Field of the Invention

The invention relates to a noise shield cable and a method of manufacturing the same.

2. Description of the Related Art

JP-B-3712846 discloses a method of suppressing noise from cable, in which an insulating material of an outer cover covering a cable core is formed of a composite magnetic material composed of an organic binder and flat or needle-shaped soft magnetic powder of which surface is an oxidized metal or an alloy.

JP-A-10-56292 discloses a method of manufacturing a shielding sheet in which oblate powder of a soft magnetic metal or an alloy thereof having an average particle size of not more than 100 μm and an aspect ratio of not less than 2 is dispersed and embedded in a soft insulating material so that the major axis thereof is substantially along the planar direction of the sheet on the cross section, and the method includes a step of mixing an insulating material having fluidity with powder of a metal or an alloy thereof having an average particle size of not more than 100 μm, and a step of passing the obtained powder-mixed insulating material between a pair of rolls or extruding through a flat opening of a die so that the power is dispersed and embedded in a flat soft insulating material on the cross section.

SUMMARY OF THE INVENTION

The magnetic permeability of noise shielding layer is higher when the aspect ratio of soft magnetic powder is larger and orientation of the powder in the noise shielding layer is better, and the noise suppression effect is more improved when magnetic permeability of a layer containing the powder is higher. Therefore, it is desirable to increase the aspect ratio of magnetic powder and to improve orientation of the magnetic powder.

However, since magnetic powder having a high aspect ratio is likely to be influenced by the flow of resin at the time of extrusion, the orientation of such magnetic powder in the noise shielding layer becomes poor due to even slight disorder of the resin flow. Poor orientation, once occurred, causes further disorder of the orientation.

In addition, when using the method in which the powder-mixed insulating material is passed between a pair of rolls or the method in which a material is flattened by pressing, it is difficult to obtain satisfactory orientation of magnetic powder.

It is an object of the invention to provide a noise shield cable that allows even magnetic powder with a high aspect ratio to have good orientation, as well as a method of manufacturing the noise shield cable.

(1) According to an embodiment of the invention, a method of manufacturing a noise shield cable, wherein the noise shield cable comprises a conductor, an insulation provided around the conductor, a noise shielding layer provided around the insulation and a sheath provided around the noise shielding layer, comprises:

providing an insulating material comprising a magnetic powder;

pressing and then rolling the insulating material to form a sheet; and winding the sheet around the insulation to form the noise shielding layer, wherein an aspect ratio of the magnetic powder represented by a maximum length/a maximum thickness is more than 10.

In the above embodiment (1) of the invention, the following modifications and changes can be made.

(i) The aspect ratio is not less than 20.

(ii) A mixture ratio of the magnetic powder to the insulating material in the noise shielding layer is 5 to 60 vol %.

(2) According to another embodiment of the invention, a noise shield cable comprises:

a conductor;

an insulation provided around the conductor;

a noise shielding layer provided around the insulation and comprising an insulating material mixed with a magnetic powder; and a sheath provided around the noise shielding layer, wherein an aspect ratio of the magnetic powder represented by the maximum length/the maximum thickness is more than 10, and wherein a degree of orientation of the magnetic powder represented by a definition below is not less than 0.9.

Degree of orientation=$\Sigma_{i=1}^{n}$ frequency (%) of angle θi of magnetic powder×|cos θi|/$\Sigma_{i=1}^{n}$ frequency (%) of angle θi of magnetic powder, where n is a natural number indicating a number of different inclinations (with angles θ) of the magnetic powder.

EFFECTS OF THE INVENTION

According to an embodiment of the invention, a noise shield cable can be provided that allows even magnetic powder with a high aspect ratio to have good orientation, as well as a method of manufacturing the noise shield cable.

BRIEF DESCRIPTION OF THE DRAWINGS

Next, the present invention will be explained in more detail in conjunction with appended drawings, wherein:

FIGS. 2A to 2C are schematic diagrams illustrating some steps of manufacturing the noise shield cable in the embodiments of the invention, wherein FIG. 2A shows a press working step, FIG. 2B shows a step of roll processing and FIG. 2C shows a winding step;

DETAILED DESCRIPTION OF THE PREFERRED EMBODIMENTS

Embodiments of the invention will be described below in reference to the drawings.

First embodiment

Figure 1:
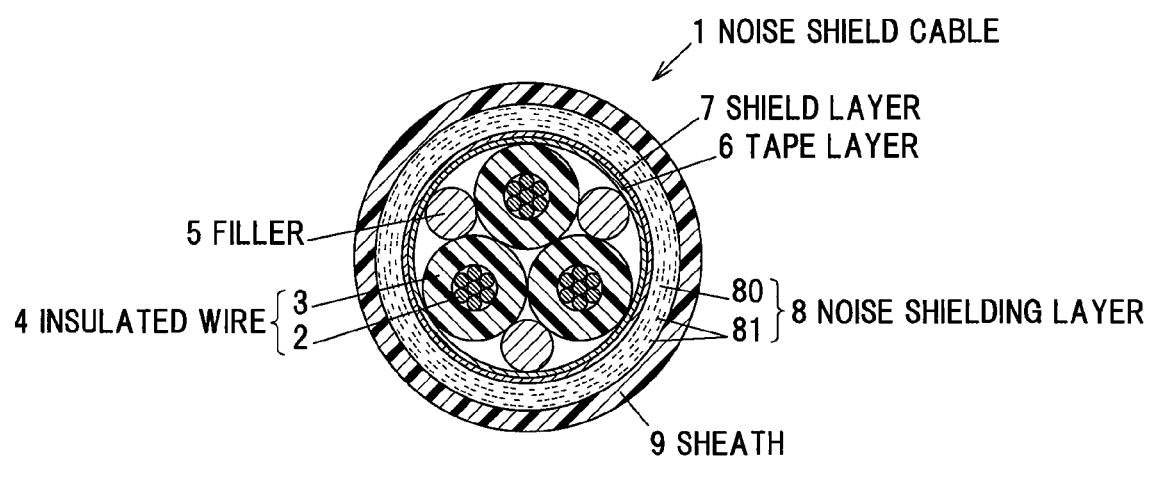
FIG. 1 is a schematic cross sectional view showing a configuration of a noise shield cable in a first embodiment of the present invention.

FIG. 1 is a schematic cross sectional view showing a configuration of a noise shield cable in the first embodiment of the invention.

A noise shield cable 1 shown in FIG. 1 is provided with plural insulated wires 4 (three in the first embodiment) each formed by covering a conductor 2 with an insulation 3, a resin tape layer 6 wound around the plural insulated wires 4 with fillers 5 interposed therebetween, a shield layer 7 provided around the resin tape layer 6, a noise shielding layer 8 provided around the shield layer 7 and a sheath 9 as an insulating protective layer formed of a resin, etc., and provided around the noise shielding layer 8.

The conductor 2 is formed of a general material such as pure copper or tin-plated copper, and is formed by twisting plural thin metal wires (seven in the first embodiment) together. The insulation 3 is not specifically limited as long as it is an insulation which can be used for electric wire/cable.

The insulated wire 4 transmits a signal of, e.g., 1 MHz to 10 GHz. The number of the insulated wires 4 is more than one in the first embodiment but may be one. In addition, the insulated wire 4 may be a twisted pair which transmits differential signals.

The resin tape layer 6 is formed by, e.g., winding a resin tape around the plural insulated wires 4 with the fillers 5 formed of paper, etc., interposed therebetween throughout a longitudinal direction of the cable. As the rein tape, it is possible to use, e.g., a tape formed of a resin such as polyethylene terephthalate (PET) or polypropylene-based resin.

The shield layer 7 is formed by braiding conductive wires and is connected to a ground. Alternatively, the shield layer 7 may be formed by winding a tape with a conductor attached thereto.

The noise shielding layer 8 is composed of a resin 80 as an insulating material and magnetic powder 81 mixed thereto.

As the resin 80, it is possible to use, e.g., olefin-based resin, vinyl chloride resin, ethylene vinyl acetate polymer, fluorine-based resin and silicone-based resin, etc. In addition, the resin 80 is preferably crystalline rather than amorphous so that the flat direction of the magnetic powder 81, when having a flat shape, is oriented along longitudinal and circumferential direction of the cable.

The magnetic powder 81 is preferably magnetic powder having a high magnetic permeability, e.g., magnetic powder having a relative magnetic permeability of 1,000 to 100,000.

A material of the magnetic powder is preferably a soft magnetic material. As the soft magnetic material, it is possible to use, e.g., ferrite powder such as Mn—Zn ferrite powder, Ni—Zn ferrite powder or Ni—Zn—Cu ferrite powder, and soft magnetic metal powder such as Fe—Ni alloy (permalloy), Fe—Si—Al alloy (sendust) or Fe—Si alloy (silicon steel).

Figure 3:
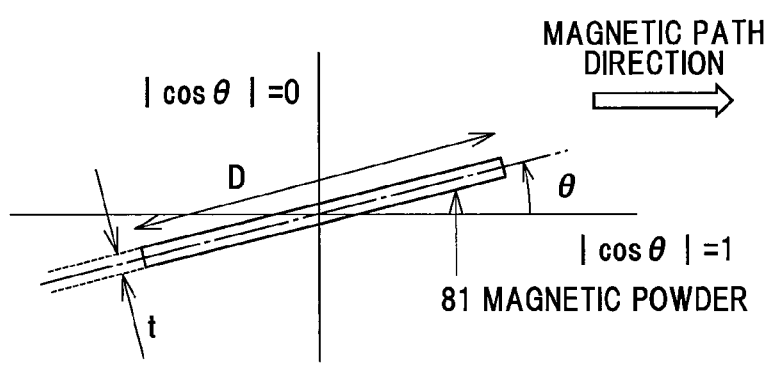
FIG. 3 is an explanatory diagram illustrating the definition of the degree of orientation of magnetic powder.

The aspect ratio of the magnetic powder 81, which is represented by the maximum length/the maximum thickness, is more than 10. In FIG. 3, D denotes the maximum length of the magnetic powder 81 and t denotes the maximum thickness of the magnetic powder 81. The aspect ratio is preferably not less than 20, more preferably not less than 30, and further preferably not less than 35. The upper limit of the aspect ratio is preferably not more than 90, more preferably not more than 80, further preferably not more than 70, and most preferably not more than 60.

When the aspect ratio is not more than 10, it is difficult to obtain a desired relative magnetic permeability and it is also difficult to obtain an effect of improving orientation of the magnetic powder 81 by a method of providing the noise shielding layer 8 (described later). On the other hand, when the aspect ratio is more than 90, the magnetic powder 81 is more likely to be damaged during molding to form the noise shielding layer 8.

Not all grains of the magnetic powder 81 need to satisfy such an aspect ratio, but this aspect ratio is satisfied by preferably not less than 80%, more preferably not less than 90% of the total magnetic powder 81.

In the embodiments of the invention, the degree of orientation of the magnetic powder 81 represented by the following definition (where n is a natural number indicating the number of different inclinations (angles θ) of the magnetic powder 81) is not less than 0.9. The degree of orientation is desirably not less than 0.91, more desirably not less than 0.92. There is no specific upper limit but not more than 0.96 is realistic in production, and not more than 0.95 is more realistic. In the actual measurement, the noise shielding layer 8 is cut to a predetermined length (e.g., 0.5 to 1.5 m) in a cable longitudinal direction and is then subjected to the measurement.

Degree of Orientation=$\Sigma_{i=1}^{n}$ frequency (%) of angle θi of magnetic powder×|cos θi|/$\Sigma_{i=1}^{n}$ frequency (%) of angle θi of magnetic powder Here, |cos θi| is an absolute value of cos θ for an inclination (angle θ) of each grain of the magnetic powder 81 relative to a magnetic path direction (direction of magnetic field) (see FIG. 3). Meanwhile, the frequency (%) of angle $\theta_i$ of magnetic powder is a frequency of inclination (angle $\theta_i$) obtained by image processing.

As shown in FIG. 3, |cos θ|=|cos 0°|=1 when a flat surface of the magnetic powder 81 is parallel to the magnetic path direction, and |cos θ|=|cos 90°|=0 when the flat surface of the magnetic powder 81 is perpendicular to the magnetic path direction.

For example, when the magnetic powder 81 have grains with the inclinations (angles) $\theta_1$ to $\theta_5$ where the frequency of the angle having |cos $\theta_1$|=0.92 is 10% of the total magnetic powder 81, the frequency of the angle having |cos $\theta_2$||=0.93 is 20% of the total, the frequency of the angle having |cos $\theta_3$||=0.94 is 30% of the total, the frequency of the angle having |cos $\theta_4$|=0.95 is 30% of the total and the frequency of the angle having |cos $\theta_5$|=0.96 is 10% of the total, the degree of orientation based on the above-mentioned definition is (10×0.92+20×0.93+30×0.94+30×0.95+10×0.96)/(10+20+30+30+10)=0.941.

The orientation of the magnetic powder 81 in the noise shielding layer 8 can be improved when the magnetic powder 81 is provided by the method described below. In other words, it is possible to improve the degree of orientation. Good orientation herein means the arrangement with which the magnetic powder 81 exerts a high noise suppression effect (good noise suppression efficiency). In other words, it is an arrangement in which a large portion of the conductor 2 is covered by the magnetic powder 81. In detail, for example, the magnetic powder 81 is oriented so that a surface having a larger area is along the longitudinal and circumferential direction of the cable.

Figure 2A:
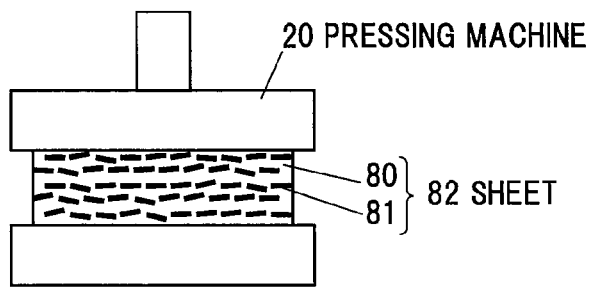
Figure 2B:
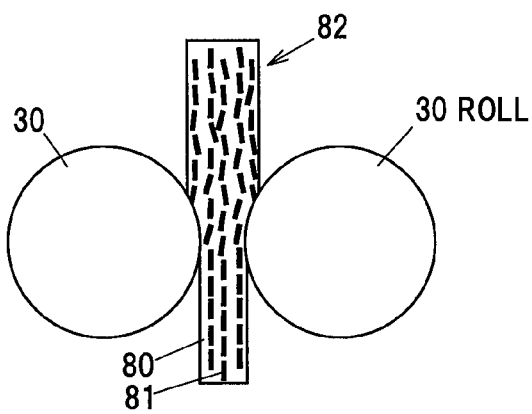
Figure 2C:
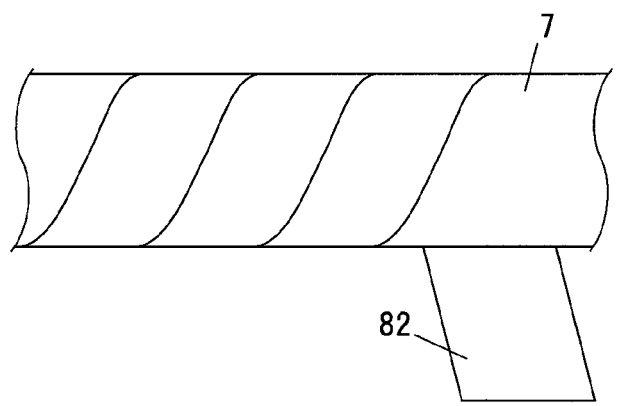

FIGS. 2A to 2C are schematic diagrams illustrating some steps of manufacturing the noise shield cable in the embodiments of the invention, wherein FIG. 2A shows a press working step, FIG. 2B shows a step of roll processing and FIG. 2C shows a winding step.

In a method of manufacturing the noise shield cable 1 in the embodiment of the invention, the noise shielding layer 8 is provided through a press working of an insulating material (the resin 80) containing the above-described magnetic powder 81 by a pressing machine 20 (FIG. 2A), a subsequent roll processing by passing a sheet 82 between rolls 30 (FIG. 2B) and a step of winding the formed sheet 82 around the insulation 3 (FIG. 2C). In the first embodiment, the sheet 82 is wound directly on the shield layer 7 which is provided around the insulation 3. The orientation improving effect is not sufficiently obtained by the press working alone or the roll processing alone. It is also important to perform the press working and the roll processing in this sequence, since the orientation improving effect is not sufficiently obtained when the sequence is reversed.

In the step of winding the sheet 82, the sheet 82 is wound spirally either with or without overlaps.

The magnetic powder 81 is preferably substantially uniformly dispersed in the noise shielding layer 8 (the resin 80). The mixture ratio of the magnetic powder 81 to the resin 80 is preferably 5 to 60 vol %. In view of both of cable flexibility and electromagnetic wave noise suppression effect, 10 to 40 vol % is more preferable.

The thickness of the noise shielding layer 8 is not specifically limited but is preferably from 100 to 1000 µm.

The sheath 9 is formed of, e.g., the same resin as the base resin 80 used to form the noise shielding layer 8. Mechanical strength is enhanced by covering the shield layer 7 with a covering layer having a two-layer structure composed of the noise shielding layer 8 and the sheath 9. The sheath 9 can be provided by extrusion coating.

Second Embodiment

Figure 4:
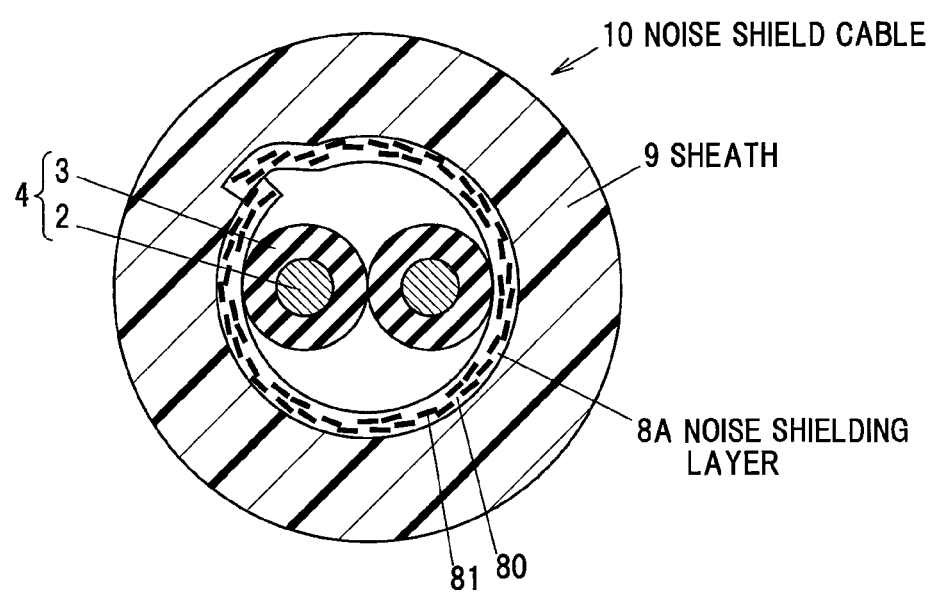
FIG. 4 is a schematic cross sectional view showing a configuration of a noise shield cable in a second embodiment of the invention.

FIG. 4 is a schematic cross sectional view showing a configuration of a noise shield cable in the second embodiment of the invention.

A noise shield cable 10 shown in FIG. 2 is provided with plural insulated wires 4 (two in the second embodiment) each formed by covering the conductor 2 with the insulation 3, a noise shielding layer 8A provided around the plural insulated wires 4, and the sheath 9 as an insulating protective layer formed of a resin, etc., and provided around the noise shielding layer 8A.

The noise shield cable 10 is different from the noise shield cable 1 in the first embodiment in that a single core, not twisted wire, is used as the conductor 2, two insulated wires 4, not three, are provided, the filler 5, the tape layer 6 and the shield layer 7 are omitted and the noise shielding layer is longitudinally wrapped (cigarette wrapped), not spirally wound. Other features are basically the same as the first embodiment and the explanation thereof is omitted.

The noise shield cables in the embodiments of the invention are applicable as communication cable, LAN cable, coaxial cable, power cable and control/instrumentation cable, etc.

Embodiments of the invention are not limited to those described above and various embodiments can be implemented.

In addition, some of the constituent elements in the embodiments can be omitted or changed without changing the gist of the invention. For example, the filler 5 may be omitted in the first embodiment as long as no problem arises when winding a resin tape around the plural insulated wires 4.

Effects of the Embodiments

The following effects are obtained in the embodiments.

(1) It is possible to provide a noise shield cable in which even magnetic powder having a high aspect ratio can be arranged with good orientation. It is thus possible to obtain a noise shield cable with improved noise suppression performance.

(2) The amount of the magnetic powder used can be reduced to obtain the same magnetic permeability as the conventional technique (spherical magnetic powder). This reduces the weight of cable and improves flexibility.

Example

Next, the invention will be described in more detail based on Example. However, the invention is not limited thereto.

To make the noise shield cable 1 in the first embodiment of the invention which has the structure shown in FIG. 1, a mixture of magnetic powder 81 (product name: FINEMET (registered trademark), manufactured by Hitachi Metals, Ltd.) and an olefin-based resin 80 (product name: TAFMER (registered trademark) DF740, manufactured by Mitsui Chemicals, Inc.) was prepared as a material of the noise shielding layer 8. The aspect ratio of the magnetic powder 81 represented by the maximum length/the maximum thickness was 75. The mixture ratio of the magnetic powder 81 to the resin 80 was 20 vol %.

The prepared material was pressed by the pressing machine 20 and then rolled by passing between the rolls 30, thereby making the sheet 82.

The obtained sheet 82 was spirally wound without gaps directly on the shield layer 7 shown in FIG. 1 and the sheath 9 was extruded to cover the outer periphery of the sheet 82, thereby obtaining the noise shield cable 1 in Example.

Meanwhile, a noise shield cable having a noise shielding layer formed by extrusion coating was made as Comparative Example. The same material as the sheet 82 was used as the extrusion coating material. The remaining configuration was the same as Example.

Noise shield cables were made, two each for Example and Comparative Example (Samples 1, 2, Comparative Samples 1 and 2), in accordance with the above-described manufacturing method.

Figure 5:
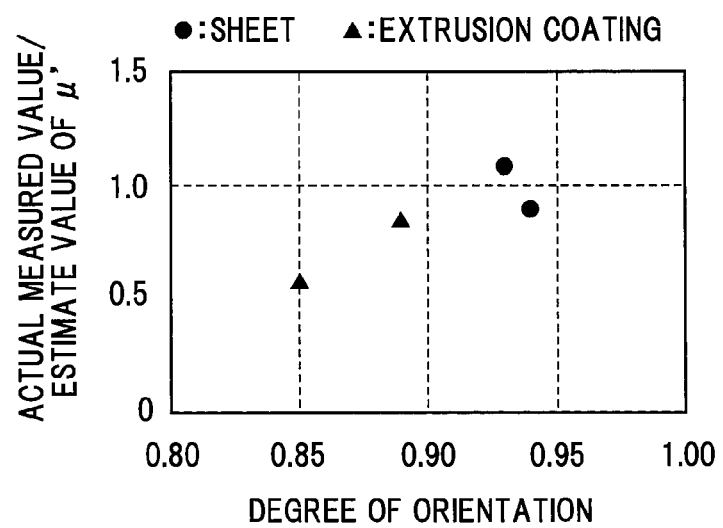
FIG. 5 is a diagram illustrating a relation between the degree of orientation and actual measured value/estimate value of magnetic permeability in Example (sheet) and in Comparative Example (extrusion coating)

FIG. 5 is a diagram illustrating a relation between the degree of orientation and actual measured value/estimate value of magnetic permeability in Example (sheet) and in Comparative Example (extrusion coating).

The degree of orientation was derived by the previously-described method. The actual measured values of magnetic permeability µ' were obtained by measurement using a B-H analyzer (E4991A, manufactured by Agilent Technologies). Meanwhile, the estimate values of µ' were obtained by calculation based on the parameters of the magnetic powder which are the filling level of the magnetic powder, magnetic permeability inherent in magnetic powder material and a demagnetizing coefficient approximately calculated from the shape (diameter and thickness) of the magnetic powder.

The degree of orientation was 0.93 and the actual measured value/estimate value of μ' was 1.1 for Sample 1, and the degree of orientation was 0.94 and the actual measured value/estimate value of μ' was 0.85 for Sample 2. On the other hand, the degree of orientation was 0.85 and the actual measured value/estimate value of μ' was 0.55 for Comparative Sample 1, and the degree of orientation was 0.89 and the actual measured value/estimate value of μ' was 0.84 for Comparative Sample 2.

The magnetic powder in the extrusion coating resin in Comparative Example had a low degree of orientation and a resulting low magnetic permeability. In contrast, the magnetic powder in the resin of the sheet 82 in Example had a high degree of orientation and a high magnetic permeability.

Figure 6:
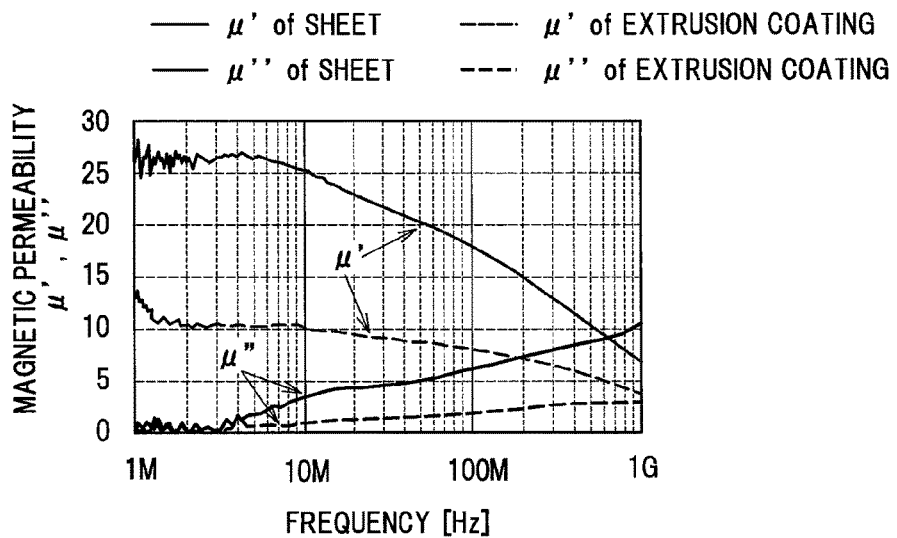
FIG. 6 is a graph showing magnetic permeability at various frequencies in Example (sheet) and in Comparative Example (extrusion coating)

FIG. 6 is a graph showing magnetic permeability at various frequencies in Example (sheet) and in Comparative Example (extrusion coating).

μ' is a real part of complex magnetic permeability μ and μ' is an imaginary part (μ=μ'−μ", j: unit of imaginary number). μ" is related to loss. The larger the loss coefficient tan δ (=μ"/μ'), the more the emitted noise is absorbed.

Magnetic permeability was measured on the noise shield cables made as Sample 1 and Comparative Sample 1 at various frequencies. The complex magnetic permeability μ was calculated using actual measurement data obtained by the B-H analyzer (E4991A, manufactured by Agilent Technologies) and the equation (μ=μ'−jμ").

The magnetic permeability of the extrusion coating layer in Comparative Example was less than that of the noise shielding layer 8 (the sheet 82) in Example due to a small specific gravity (a low filling level of magnetic powder), cracking of magnetic powder (a decrease in the aspect ratio) and poor orientation of the magnetic powder.

Figure 7A:
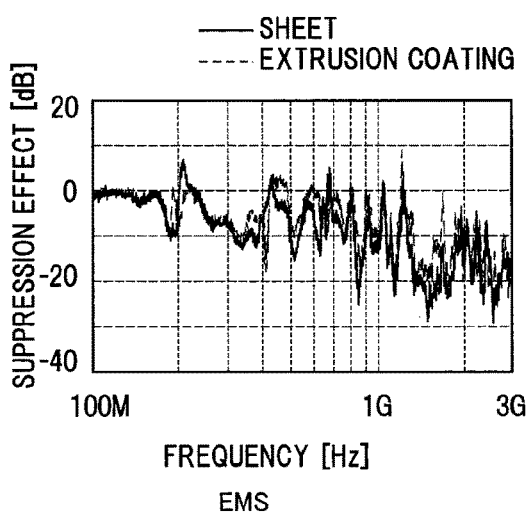
FIGS. 7A and 7B are graphs showing a suppression effect at various frequencies in Example (sheet) and in Comparative Example (extrusion coating)
Figure 7B:
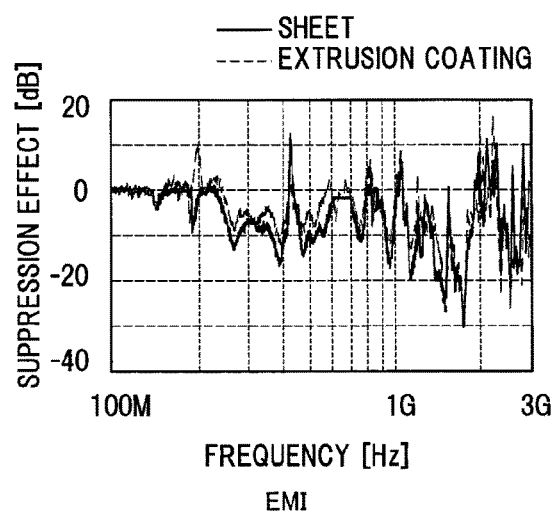

FIGS. 7A and 7B are graphs showing a suppression effect at various frequencies in Example (sheet) and in Comparative Example (extrusion coating).

Figure 8:
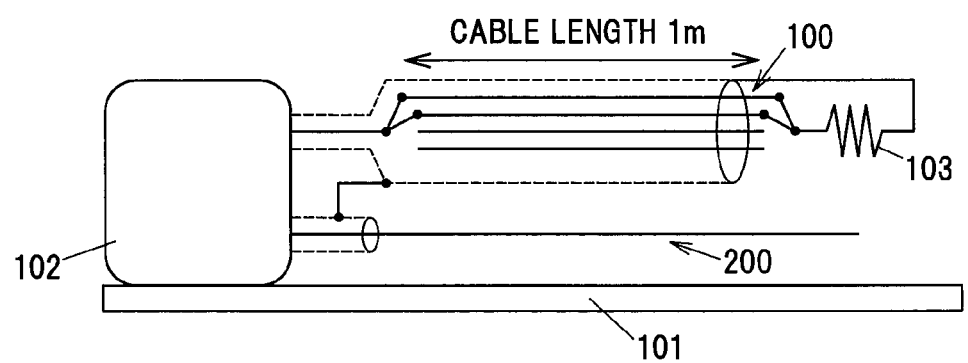
FIG. 8 is a schematic diagram illustrating a method of measuring the noise suppression effect of the noise shield cable.

The noise suppression effect was measured on the noise shield cables made as Sample 1 and Comparative Sample 1 at various frequencies. FIG. 7A shows the EMS measurement results and FIG. 7B shows the EMI measurement results. FIG. 8 is a schematic diagram illustrating a method of measuring the noise suppression effect of the noise shield cable.

EMS and EMI were measured using a spectrum analyzer 102 (with tracking generator) placed on a table 101, as shown in FIG. 8. In detail, a signal was input from the tracking generator to a coaxial cable 200, and a signal induced by a noise shield cable 100 having a terminating resistor 103 was measured by the spectrum analyzer 102 (EMI measurement). Meanwhile, a signal was input to the noise shield cable 100 and a signal induced by the coaxial cable 200 was measured by the spectrum analyzer 102 (EMS measurement).

In both measurement results, the extrusion coating layer in Comparative Example had a lower suppression effect than the noise shielding layer 8 (the sheet 82) in Example. Particularly in the GHz range in which loss tans δ (μ"/μ') increases, the noise shielding layer 8 (the sheet 82) in Example had a higher effect, such as 2 dB higher in EMS measurement and about 6 dB higher in EMI measurement.

What is claimed is:

1. A method of manufacturing a noise shield cable, wherein the noise shield cable comprises a conductor, an insulation provided around the conductor, a noise shielding layer provided around the insulation and a sheath provided around the noise shielding layer, the method comprising:
   providing an insulating material comprising a magnetic powder;
   pressing and then rolling the insulating material to form a sheet; and
   winding the sheet around the insulation to form the noise shielding layer,
   wherein an aspect ratio of the magnetic powder represented by a maximum length/a maximum thickness is more than 10.

2. The method according to claim 1, wherein the aspect ratio is not less than 20.

3. The method according to claim 1, wherein a mixture ratio of the magnetic powder to the insulating material in the noise shielding layer is 5 to 60 vol %.

4. A noise shield cable, comprising:
   a conductor;
   an insulation provided around the conductor;
   a noise shielding layer provided around the insulation and comprising an insulating material mixed with a magnetic powder; and
   a sheath provided around the noise shielding layer,
   wherein an aspect ratio of the magnetic powder represented by the maximum length/the maximum thickness is more than 10, and
   wherein a degree of orientation of the magnetic powder represented by a definition below is not less than 0.9
   Degree of orientation=$\Sigma_{i=1}^{n}$ frequency (%) of angle θi of magnetic powder×|cos θi|/$\Sigma_{i=1}^{n}$ frequency (%) of angle θi of magnetic powder, where n is a natural number indicating a number of different inclinations (with angles θ) of the magnetic powder.

\* \* \* \* \*